United States Patent

Freedman et al.

[15] 3,649,918

[45] Mar. 14, 1972

[54] PULSED OSCILLATOR

[72] Inventors: Nathan Freedman, West Newton; Harold M. Hart, Wellesley, both of Mass.

[73] Assignee: Raytheon Company, Lexington, Mass.

[22] Filed: June 9, 1970

[21] Appl. No.: 44,825

[52] U.S. Cl. ..............................325/164, 325/125, 325/161, 325/164, 330/56, 331/172, 331/173

[51] Int. Cl. ..........................................................H04b 1/04

[58] Field of Search..................325/104, 105, 120, 121, 141, 325/161, 164, 167, 123, 124, 125, 129, 130; 331/172, 173, 6, 7, 59; 330/45, 47, 48, 56; 333/83 R

[56] References Cited

UNITED STATES PATENTS

| | | | |
|---|---|---|---|
| 2,750,506 | 6/1956 | Haagensen | 325/121 |
| 3,328,720 | 6/1967 | Armtsen | 331/59 |
| 3,089,967 | 5/1963 | Strull | 325/105 |

*Primary Examiner*—Robert L. Richardson
*Assistant Examiner*—Albert J. Mayer
*Attorney*—Philip J. McFarland and Joseph D. Pannone

[57] ABSTRACT

Radio frequency circuits for amplifying the level of the power produced by an oscillator, preferably a solid state oscillator. The disclosed circuits include a resonant cavity in which oscillations are built up by loosely coupling such cavity to the oscillator and periodically discharging the cavities through a tightly coupled load, discharging being accomplished by actuating of a high-speed switch in the output circuit.

2 Claims, 2 Drawing Figures

INVENTORS
NATHAN FREEDMAN
HAROLD M. HART

PULSED OSCILLATOR

BACKGROUND OF THE INVENTION

This invention pertains generally to radiofrequency oscillator circuits and in particular to pulse circuits of such nature utilizing solid-state elements.

It is known in the art that so-called "solid-state" devices may be used to generate signals in the microwave range of the electromagnetic spectrum. It is also known that such devices, as compared to electron discharge devices used for such a purpose, are very much smaller, more efficient and more reliable. Unfortunately, however, known solid-state devices are limited in the amount of radiofrequency energy which they may produce. As a result of such limitation, the applications of solid-state devices have been limited to those in which low power levels may be tolerated and accepted.

It is, therefore, a primary object of this invention to provide an improved solid-state generator for radiofrequency energy, such generator being adapted to provide a higher power level than known solid-state generators of such energy.

Another object of this invention is to provide an improved solid-state generator for radiofrequency energy utilizing known conventional elements.

SUMMARY OF THE INVENTION

These and other objects of this invention are attained by charging, from a solid-state source of radiofrequency energy, a resonator with a high Q until oscillations therein are built up to a level higher than the level of the solid-state source and then discharging the resonator through an electronic switch to pass a relatively narrow, but high level, pulse of energy to a load, as an antenna. In one embodiment of this invention, the solid-state source is an oscillator which is periodically modulated to produce relatively wide, but low level, pulses of electromagnetic energy; in a second embodiment, the source is an amplifier with positive feedback from the resonator so as to cause such amplifier to oscillate at least during the intervals between output pulses.

BRIEF DESCRIPTION OF THE DRAWINGS

For a more complete understanding of this invention reference is now made to the detailed description of the accompanying drawings in which.

DESCRIPTION OF THE PREFERRED EMBODIMENTS

Figure 1:
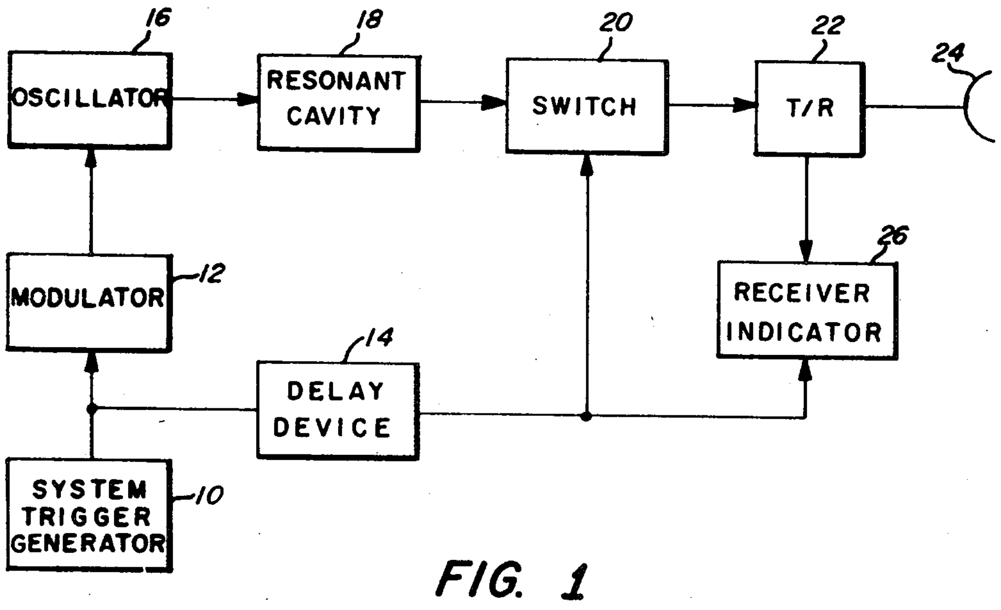
FIG. 1 is a block diagram of a system according to this invention in which a pulsed solid-state oscillator is used.

Referring now to FIG. 1, a system trigger generator 10 of conventional construction is shown as the master synchronizer for the contemplated system, such generator being connected to a modulator 12 and a delay device 14. The former, which may also be of conventional construction, produces a control signal for an oscillator 16. Such oscillator may take any known form, as, for example, a crystal oscillator and multiplier chain. When the oscillator 16 is gated on in response to each control signal from the modulator 12, radiofrequency signals at a predetermined frequency build up and are fed to a resonator, here a resonant cavity 18. The latter element is so proportioned as to be resonant at the frequency of the radiofrequency signals out of the oscillator 16. Further, the Q of the resonant cavity 18 is relatively high and the coupling between the oscillator 16 and the resonant cavity 18 is relatively loose. Consequently, during the period of time in which the oscillator 16 is gated on, the level of the oscillations in the resonant cavity 18 builds up to a level higher than the level of the oscillations out of the oscillator 16. An output line (not numbered) couples, through a switch 20, the resonant cavity 18 to a load, here a transmit/receive device 22 and an antenna 24. The coupling of the output line to the resonant cavity 18 is relatively tight as compared to the coupling between such cavity and the oscillator 16. The switch 20, which preferably is a high-speed microwave switching element, as a PIN diode, is switched on by each system trigger after a predetermined delay in a delay device 14. Echo signals received by the antenna 24 are passed through the transmit/receive device 22 to a receiver/indicator 26 for detection and display in any known way.

The just-described circuit operates in the following manner. The modulator 12, in response to each system trigger, produces a control signal to turn on the oscillator 16 for a period of time at least equal to the reciprocal of the bandwidth of the resonant cavity 18 in combination with the oscillator 16. During such period, oscillations build up in the resonant cavity 18 to a level determined by the Q of such cavity in combination with the output impedance of the oscillator 16 and the degree of coupling between such oscillator and cavity. In a working embodiment of this invention the Q of the resonant cavity 18 in combination with the oscillator 16 was maintained at a value of 2360. Consequently during the charging time of the resonant cavity 18 in such embodiment, the amplitude of the oscillations therein becomes much higher than the amplitude of the signals out of the oscillator 16. When a delayed system trigger is applied to the switch 20, the load on the output circuit of the resonant cavity 18 changes from almost infinity to a value determined essentially by the impedance of the load, here the antenna 24, modified by the degree of coupling thereof to the resonant cavity 18. The Q of the resonant cavity 18 is effectively lowered when the switch 20 is actuated, rendering such cavity incapable of sustaining the level of the oscillations then existing therein. In a practical embodiment, the value of Q was then about 400. Consequently, the greater part of the energy in the resonant cavity 18 is discharged into the load, the time taken for discharge being approximately equal to the reciprocal of the bandwidth of the resonant cavity 18 with the load connected. In other words the time duration of the output waveform into the load is substantially shorter than the time taken to charge the resonant cavity 18 by the oscillator 16. Neglecting losses in the resonant cavity 18 the peak power of the output pulse will be greater than the peak power of the input pulse to the resonant cavity 18 by a ratio equal to the ratio of the pulse durations. In passing, it should be noted that the input pulse time to the resonant cavity 18 is not critical, it being necessary only to have a pulse within rather wide limits to cause the amplitude of the oscillations in the resonant cavity 18 to build up to a stable state level without requiring a cavity of very large dimensions. Further, it should be noted that the switching time of the switch 20 should be less than, say, 10 percent of the length of the output pulse to avoid switching losses.

Figure 2:
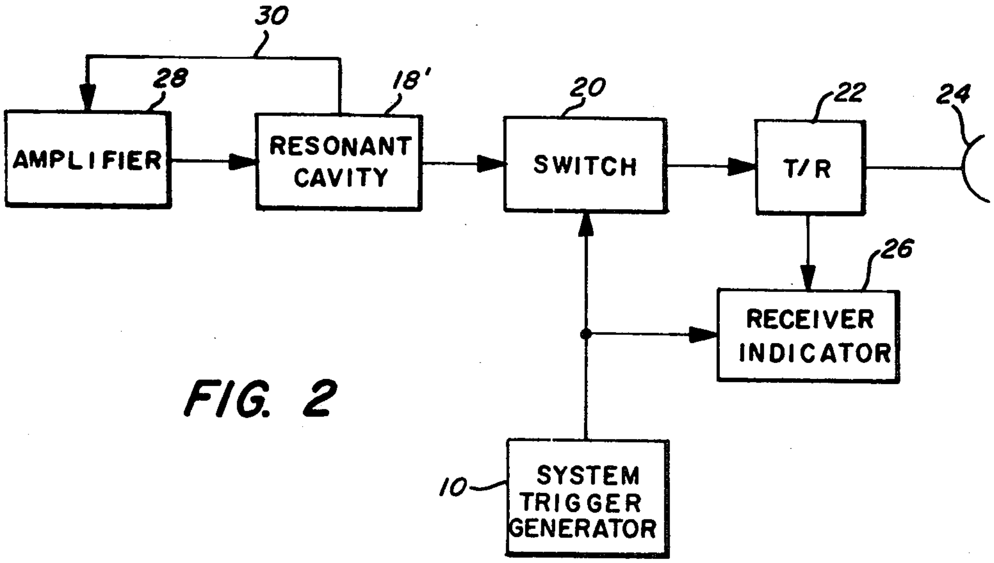
FIG. 2 is a block diagram of an alternative embodiment of this invention in which positive feedback from a resonator is used to lock the frequency of an energizing source to the frequency of such resonator.

Referring now to FIG. 2, an alternative embodiment which is inherently more stable than the embodiment shown in FIG. 1 is illustrated. It is evident that when the O of the resonant cavity 18 is very high, i.e., when the dimensions of the cavity are large relative to the wavelength of the resonant frequency, that its passband must be exactly centered on the frequency of the signals out of the oscillator 16. In FIG. 2, the output of an amplifier 28 is fed to a resonant cavity 18'. A positive feedback line 30 is led from the resonant cavity 18' back to the amplifier 28. Consequently, when the amplifier 28 is energized, random signals therefrom cause oscillations to build up in the resonant cavity 18' which, because of the positive feedback connection, force the amplifier 28 into oscillations at the frequency of the signals from the resonant cavity 18'. The output of the resonant cavity 18' is tightly coupled through a switch 20 and a transmit/receive device 22, to an antenna 24 as before. Return signals are passed through the antenna 24 and the transmit/receive device to a receiver/indicator 26. The switch 20 is actuated by an output signal from the system trigger generator 10 as shown, it being necessary here, as in the embodiment shown in FIG. 1, that the switching time of the switch be substantially less than the length of the output pulse to avoid switching losses.

Having described two embodiments of this invention, it will be apparent to those of skill in the art that changes may be made without departing from our inventive concepts. For example, it is evident that the frequencies of the oscillator and the resonant cavity need not be the same as in the illustrated circuits, but rather may be related harmonically so long as oscillations may be built up in the resonant cavity. Further, it is evident that the single switch in the output circuit from the resonant cavity may be replaced by a number of similar switches in parallel, each such switch being actuated simultaneously to enable greater amounts of power to be passed from the resonant cavity to a load. It is felt therefore that this invention should not be restricted to its disclosed embodiments, but rather should be limited only by the spirit and scope of the appended claims.

We claim:

1. A radiofrequency pulse generator comprising:

a. a resonant cavity disposed in circuit with a source of radiofrequency energy, the resonance frequency of such cavity being harmonically related to the frequency of the radiofrequency energy out of such source and the "Q" of the combination of such cavity and such source exceeding 2,000;

b. normally open switching means disposed in circuit with the resonant cavity and a load, the "Q" of the combination of such cavity, such switching means, when closed, and such load not exceeding 400; and c. means for alternately actuating the source of radiofrequency energy and closing the normally open switching means first to cause the resonant cavity to resonate at its resonance frequency and then to discharge through the load.

2. A radiofrequency pulse generator as in claim 1 wherein the means for alternately actuating the source of radiofrequency energy and closing the normally open switching means includes:

a. a trigger generator for producing trigger pulses;

b. a modulator, responsive to each one of such trigger pulses, for actuating the source of radiofrequency energy for a period of time at least as long as the reciprocal of the bandwidth of the resonant cavity in circuit with such source; and, c. delay means, in circuit between the trigger generator and the normally open switching means and responsive to each one of such trigger pulses, for delaying each one thereof by a period of time substantially equal to the period of time during which the source of radiofrequency signals is actuated.

* * * * *